(12) United States Patent
Minagawa et al.

(10) Patent No.: US 6,551,749 B1
(45) Date of Patent: Apr. 22, 2003

(54) DEVELOPER AND METHOD FOR FORMING RESIST PATTERN AND PHOTOMASK PRODUCED BY USE THEREOF

(75) Inventors: Toshikatsu Minagawa, Kawasaki (JP); Eiichi Hoshino, Atsugi (JP); Keiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/526,295

(22) Filed: Mar. 15, 2000

(30) Foreign Application Priority Data

Apr. 9, 1999 (JP) .......................................... 11-102591

(51) Int. Cl.⁷ ................................................ G03F 9/00
(52) U.S. Cl. ........................... 430/5; 430/296; 430/325; 430/907; 430/331
(58) Field of Search ........................... 430/331, 5, 325, 430/296, 905

(56) References Cited

U.S. PATENT DOCUMENTS

| | | | |
|---|---|---|---|
| 4,178,403 A | * 12/1979 | Sakurai et al. | 428/209 |
| 4,405,707 A | * 9/1983 | Bierhenke et al. | 430/281 |
| 4,609,615 A | * 9/1986 | Yamashita et al. | 430/325 |
| 4,665,009 A | * 5/1987 | Brault | 430/325 |
| 5,045,220 A | * 9/1991 | Harris et al. | 252/8.554 |

FOREIGN PATENT DOCUMENTS

| | | | |
|---|---|---|---|
| JP | 55-155353 | | 12/1980 |
| JP | 58-192036 | | 11/1983 |
| JP | 59-2043 | | 1/1984 |
| JP | 61-151535 | * | 7/1986 |

OTHER PUBLICATIONS

CA 106: 129346, CA abstract of JP 61–151535.*
JPO Abstract of JP 60–090336.*
JPO Abstract of JP 4–02018560.*
English Translation of JP 61–151535, Jul. 1986, Naraoka et al.*

* cited by examiner

Primary Examiner—Rosemary Ashton
(74) Attorney, Agent, or Firm—Armstrong, Westerman & Hattori, LLP

(57) ABSTRACT

A developer used for the formation of a resist pattern from a resist resin based on a halogenated alkylstyrene, wherein the developer is a mixture of a solvent regarded as a good solvent and a solvent regarded as a poor solvent for the resist resin based on a halogenated alkylstyrene. The developer is useful for the formation of photomasks, including various masks and reticles used to form various device patterns in a semiconductor product, a plasma display panel (PDP), a liquid crystal display (LCD) or the like. A method of forming a resist pattern using the developer is also disclosed. In addition, a photomask produced using the developer and the method is disclosed.

10 Claims, 5 Drawing Sheets

DEVELOPER AND METHOD FOR FORMING RESIST PATTERN AND PHOTOMASK PRODUCED BY USE THEREOF

BACKGROUND OF THE INVENTION

1. Field of the Invention

The invention relates to photomasks, including a variety of masks and reticles used to form various device patterns in a semiconductor product, a plasma display panel (PDP), a liquid crystal display (LCD) or the like. More particularly, the invention relates to a resist pattern developer, and a method of forming a resist pattern, which are useful for the production of such a photomask, and a product photomask manufactured by use of the developer and method.

2. Description of the Related Art

In the manufacture of semiconductor devices, PDPs, LCDs and the like, various masks and reticles are used for the formation of their device patterns. A mask is a sheet having formed therein an original pattern and positioning marks for positioning the mask during the formation of a desired pattern in an exposure system. A reticle is a mask, which is used in the manufacture of an integrated circuit (IC), having formed therein a pattern for each one IC chip, the pattern being transferred from the reticle to a wafer by a stepper or photo repeater. Although the mask and the reticle are generally called a photomask herein, the following description is mainly directed to a mask, for simplicity.

In the manufacture of a semiconductor device, or a display unit such as PDP or LCD, many steps are carried out to form various patterns, and various masks are used therefor. These masks are made, in general, by forming a light-screening film of, for example, chromium on a transparent substrate of, for example, quartz glass, and patterning the light-screening film by a lithography process (a technique for forming a desired final pattern through formation of a resist pattern by application, exposure, and development of a resist material, etching of an underlying layer by use of the formed resist pattern, and peeling-off of the resist pattern film). For example, as a resist material, an electron beam negative resist suitable for formation of a minute pattern is used, and a portion of a resist film formed of the material to be left as a final mask pattern is exposed, according to given mask pattern data, by an electron beam exposure system, the exposed resist film is then developed using a solvent regarded as a good solvent for the unexposed resist material (a solvent having a higher solubility for the unexposed resist material) to remove the resist material in the unexposed portion which does not form the final resist pattern, and a light-screening film is then patterned by etching using the remaining resist pattern as an etching mask. Thus, in the case where a mask pattern is formed using a negative resist of crosslinking type, a final negative resist pattern for the formation of a mask pattern is formed by crosslinking molecules of the resist material by electron beam irradiation, and transforming the material at the irradiated portion into a condition which is not removed by development.

Electron beam negative resists presently used include resists based on halogenated alkylstyrene, a representative of which is a resist using, as a base resin, a copolymer of chloromethylstyrene and chlorostyrene. In the case of the resist of a copolymer of chloromethylstyrene and chlorostyrene, as a developer therefor, an organic solvent, such as ethyl cellosolve, isoamyl acetate, or methyl isobutyl ketone, is used alone or a liquid mixture of such organic solvents is used.

Recently, mask patterns have been formed at a noticeably higher density and more minutely, and are required to be formed more precisely and to have a higher quality than before.

As a developer used in the formation of a resist pattern prior to the formation of a final mask pattern, a developer, which is regarded as a good solvent for the resist material (resist resin), is used, as referred to above. With a good solvent, absorption of it in a resist resin to be removed for pattern formation is high and, accordingly, the resist resin shows a higher solubility in the solvent.

However, the good absorption of solvent causes occurrence of a phenomenon of swelling of the formed resist pattern. A resin of a negative resist film forms a negative resist pattern in a developing step after exposure since the resin in the exposed areas of the resist film is crosslinked and is therefore not dissolved in a solvent. During the developing step, the resist resin in the indissoluble areas, which forms the resist pattern, absorbs the developer and increases in volume, which is a phenomenon generally called swelling. The resist pattern thus swelled shows deteriorated uniformity of molecular diameter of the resist resin. Consequently, the resultant resist pattern has partially expanded lines, and causes a photomask formed by use of it to have a deteriorated mask pattern and/or deteriorated accuracy in size.

It is thus required that the swelling of a resist during development is inhibited for the formation of a mask pattern required to be formed more precisely and to have higher quality than before.

SUMMARY OF THE INVENTION

Accordingly, an object of the invention is to provide a resist pattern developer, and a method of forming a resist pattern, which are capable of inhibiting swelling during development, which is a problem particularly when a resist material based on a halogenated alkylstyrene is used.

Another object of the invention is to provide a photomask, formed by use of the developer and method, having a good configuration of a pattern and excellent accuracy in size.

Thus, in one aspect, the invention provides a resist pattern developer which is a mixture of a solvent regarded as a good solvent and a solvent regarded as a poor solvent for a resist resin based on a halogenated alkylstyrene used for the formation of a resist pattern.

In another aspect, the invention provides a method of forming a resist pattern by forming a film of a resist resin based on a halogenated alkylstyrene to cover a light-screening film previously formed on a substrate, and patterning the resist film by exposure and development to form a resist pattern, the method comprising using, as a developer for the resist pattern to be formed, a mixture of a solvent regarded as a good solvent and a solvent regarded as a poor solvent for the resist resin based on the halogenated alkylstyrene.

In a further aspect, the invention provides a photomask comprising a substrate and a light-screening film having a certain pattern formed thereon, wherein the pattern of the light-screening film is formed by patterning a film of a resist resin based on a halogenated alkylstyrene provided on the light-screening film by use of a developer which is a mixture of a solvent regarded as a good solvent and a solvent regarded as a poor solvent for the resist resin.

BRIEF DESCRIPTION OF THE DRAWINGS

The above and other objects and advantages of the invention will be well understood and appreciated by a person with ordinary skill in the art, from consideration of the following detailed description made by referring to the attached drawings wherein.

DETAILED DESCRIPTION OF THE INVENTION

Figure 1A:
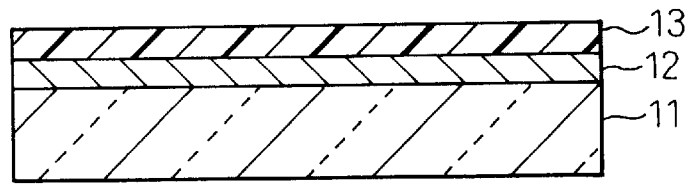
FIGS. 1A to 1D illustrate the manufacture of a photomask using a resist pattern developer of the invention.

The invention provides, as a developer used to patterning a film of resist resin prior to the formation of a final mask pattern of a mask, a developer which is a mixture of a solvent regarded as a good solvent and a solvent regarded as a poor solvent for the resist resin used, the developer being particularly useful in developing a halogenated alkylstyrene-based resist material which is prone to raise problems of a deteriorated configuration and deteriorated accuracy in the size of a formed resist pattern due to its swelling by the solvent used as the developer. As used herein, the "good solvent" means a solvent in which a resist resin to be removed for pattern formation is fully dissolved when the solvent is used alone, and which is useable as a developer, and the "poor solvent" means a solvent in which a resist resin to be removed for pattern formation cannot fully be dissolved when it is used alone, and which is not appropriate for sole use as a developer. In the invention, two or more solvents may be used as a good solvent, and two or more solvents may also be used as a poor solvent.

It can easily be determined whether a solvent is a good solvent or a poor solvent for a resist resin used, by an experiment in which solubility of the resist resin in the solvent is examined. On the other hand, using a solubility parameter, it is possible to decide a degree of solubility of a resist resin in a certain solvent, and the closer to the solubility parameter of the resist resin the solubility parameter of the solvent is, the resin is more easily dissolved in the solvent. A styrene resin used in a halogenated alkylstyrene-based resist material of the invention has a solubility parameter of 9.0 $(cal/cm^3)^{1/2}$. The inventors have found that, for the halogenated alkylstyrene-based resist resins, a solvent having a solubility parameter of not less than 8 $(cal/cm^3)^{1/2}$ and less than 11 $(cal/cm^3)^{1/2}$ can be regarded as a good solvent, and a solvent having a solubility parameter of less than 8 $(cal/cm^3)^{1/2}$ or not less than 11 $(cal/cm^3)^{1/2}$ can be regarded as a poor solvent. Consequently, for example, solvents such as ethyl cellosolve (solubility parameter: 10.7 $(cal/cm^3)^{1/2}$), isoamyl acetate (8.9 $(cal/cm^3)^{1/2}$), and methyl isobutyl ketone (8.5 $(cal/cm^3)^{1/2}$) can be regarded as good solvents, and solvents such as alcohols having a solubility parameter of not less than 11 $(cal/cm^3)^{1/2}$ can be regarded as poor solvents. A typical example of alcohols regarded as poor solvents is isopropyl alcohol (IPA) (solubility parameter: 11.5 $(cal/cm^3)^{1/2}$) and, in addition to this, methanol (14.5 $(cal/cm^3)^{1/2}$) and ethanol (12.7 $(cal/cm^3)^{1/2}$) may be used, for example. Also, as poor solvents, aliphatic compounds, such as n-hexane (7.3 $(cal/cm^3)^{1/2}$) and n-heptane (7.5 $(cal/cm^3)^{1/2}$), and ethers, such as diethyl ether (7.4 $(cal/cm^3)^{1/2}$) and dibutyl ether (7.8 $(cal/cm^3)^{1/2}$), may be used. As used herein, the solubility parameter means a value of quotient, which is raised to half power, obtained by dividing a molar latent heat of vaporization of a solvent by its malar volume, and is, in general, represented by use of the unit of $(cal/cm^3)^{1/2}$, as shown above. Hereinafter, however, this unit is not expressed, and only a value of solubility parameter represented by use of this unit is presented for simplicity.

Resists which are developed by the developer of the invention are those which comprise, as a base component, a halogenated alkylstyrene-based resin, and which are used to form a negative resist pattern by electron beam exposure. Representatives of the halogenated alkylstyrene-based resists are those based on a cyclized rubber, such as those based on a copolymeric resin of chloromethylstyrene and chlorostyrene, which are exemplified by an electron beam negative resist, "ZEN", manufactured by Nippon Zeon. In addition to such resins using chlorine as a halogen, resins using iodine or bromine are also known, and the invention may be applied to resists based on a resin using iodine or bromine as a halogen.

When the cyclized rubber-based resist is developed only by a developer which is good solvent therefor, the resist resin in an area left undissolved and forming a resist pattern absorbs the developer to thereby be expanded and increased in volume, causing a phenomenon generally called swelling. The swelled resist pattern has deteriorated uniformity of molecular diameter of the resist resin, which leads to partially expanded widths of patterned lines, and has a deteriorated configuration and deteriorated accuracy in size.

Alcohols represented by IPA and others are poor solvents for the cyclized rubber-based resists and, in addition, have a higher polarity, so that they cause the resist resin to be shrunk. Polarity is developed by an electrical imbalance of a molecule. A solvent, such as an alcohol, called a polar solvent, has a larger electrical imbalance and, consequently, has a higher polarity. Such a polar solvent has too high a polarity compared to a resist resin used to form a resist pattern for making a photomask, such as "ZEN" as referred to above. Accordingly, it is thought that molecules of the solvent which are attracted to each other are stabler when mixed with the resist resin, and are less absorbed by the resist resin, to thereby act to prevent the resist resin from being swelled. Thus, by admixing a poor solvent for a resist with a good solvent according to the invention, a development function and a swelling-preventing function (resin-shrinking function) which are sufficient for a resist can be achieved. Also, a solvent having a lower polarity than that of a resist can serve as a poor solvent, and prevent swelling of the resist.

However, problems, such as incomplete development, occur if the amount of poor solvent added is inappropriate. It is therefore important that an amount of poor solvent added is optimized so that solubility of a resist in the developer is not deteriorated. An amount of poor solvent to be added can be determined for a combination of certain good and poor solvents by experiment.

As an example of method of determining an amount of poor solvent to be added, reference can be made to a method in which, using a dynamic light scattering measurement by Rayleigh scattering, a molecular diameter of a resist resin after dissolved in a developer is measured. In the dynamic light scattering measurement by Rayleigh scattering, particles dissolved in a sample solution are irradiated with monochromatic light, such as laser beam, a shift of central frequency which is shown by Rayleigh-scattered light from each of the particles is measured to provide distribution of diameters of the dissolved particles, and, from an analysis of the particle diameter distribution thus obtained (histogram method), an intensity of scattering is determined, and a weight per particle and the total number of particles in the distribution can be obtained. For the present invention, by dissolving a certain resist resin in a mixed developer of a certain ratio of good and poor solvents, and examining scattered light from the resist resin in the solution irradiated with monochromatic light, a molecular particle diameter of the resist resin in the solution can be measured, and be compared to a molecular particle diameter of the resist resin dissolved in a developer of good solvent alone, to thereby decide degree of swelling of the resist resin by the developer. More specifically, when a resist resin in a mixed developer has a significantly smaller molecular particle diameter than a molecular particle diameter of a resist resin in a developer of good solvent alone, swelling by the mixed developer can be regarded as being inhibited.

The resist pattern developer of the invention can be used like conventional developers, as is clear from the following description which illustrates the formation of a resist pattern.

Figure 1B:
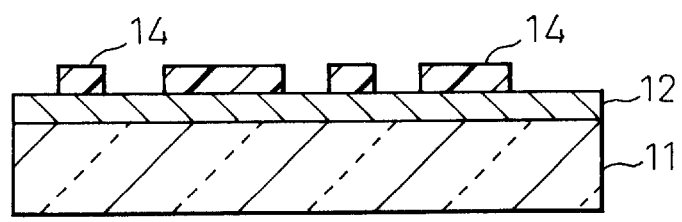

To form a resist pattern using the developer of the invention, for example, a resist film 13 is first formed, by an appropriated process, such as spin coating, on a chromium layer 12 formed by a sputtering process on a transparent substrate 11 made of quartz glass, as illustrated in FIG. 1A. The resist film 13 is then irradiated with electron beam in a certain pattern for exposure, and is developed using the developer of the invention, to thereby form a resist pattern 14, as shown in FIG. 1B.

Figure 1C:
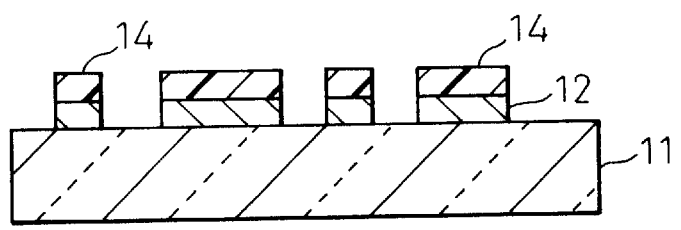
Figure 1D:
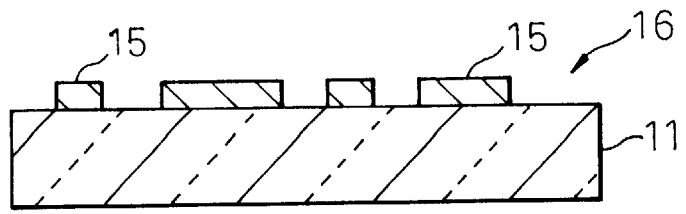

Subsequently, using the resist pattern 14 as an etching mask, the underlying chromium film 12 is etched, as shown in FIG. 1C, and the resist pattern 14 is removed using an appropriate peeling solution, whereby a product mask 16 provided with a certain mask pattern 15 can be completed, as shown in FIG. 1D.

The following examples further describe the invention. However, these examples are not intended to limit the invention in any way.

EXAMPLE 1

An electron beam negative resist "ZEN" manufactured by Nippon Zeon, which is a resist resin of chloromethylstyrene-chlorostyrene copolymer having a molecular weight of 185,000, was dissolved in each of the following developers to prepare a solution. Specifically, the solution was prepared by dissolving 0.005 gram of resist resin in 4.995 grams of solvent (developer). In the case where a sole solvent was used as a developer, the solvent was filtered and transferred to a washed bottle, and in the cases where a mixed solvent was used as a developer, the solvents were mixed in a certain ratio, and were then filtered and transferred to a washed bottle. The developer transferred to a bottle was shaken by a mixing rotor for about 1 to 2 hours to accelerate dissolution of the resist resin. The solution was then filtered using a 0.2 micrometer filter, and a sample solution was transferred to a cell for dynamic light scattering measuring unit.

Developer A

A mixture of ethyl cellosolve (solubility parameter: 10.7) and isoamyl acetate (solubility parameter: 8.9) in a weight ratio of 8:2. This was a mixed developer of two good solvents, and was a conventional developer sold as a developer for ZEN.

Developer B

A developer of sole methyl isobutyl ketone (MIBK) (solubility parameter: 8.5), which is a good solvent.

Developers C to F

Mixtures of MIBK, which is a good solvent, and isopropyl alcohol (IPA) (solubility parameter: 11.5), which is a poor solvent, in weight ratios of 9:1, 8:2, 7.5:2.5, and 7:3, respectively.

Using a sample of the prepared solution for dynamic light scattering measuring unit, the resist resin dissolved in the developer was irradiated with He-Ne laser beam by DLS-700 manufactured by Otsuka Denshi and, from observation of the resultant Rayleigh scattering, a molecular particle diameter of the dissolved resist resin was measured, in order to numerically quantify a relation between the developer and degree of swelling of the resin.

To this end, a sample is first set in the unit, and data of viscosity and refractive index of the sample, which were determined by calculation, were input to the unit. In the case where the developer of a sample was a mixture, numerical values obtained by summing up values of physical property of the respective developers multiplied by its composition rate were used. The sample solution was exposed with a He-Ne laser beam to examine Rayleigh scattering light from the resist resin particles in the solution to provide distribution of diameters of the dissolved particles, and, from analysis of particle diameter distribution thus obtained (histogram method), an intensity distribution of scattering is determined, and a weight per particle and the total number of particles in the distribution were obtained, from which a molecular particle diameter of the dissolved resin was determined. The results are shown in Table I.

TABLE I

| Developers | Resin Particle Diameters, nanometers |
| --- | --- |
| A | 18.0 |
| B | 21.9 |
| C | 21.7 |
| D | 12.2 |
| E | 11.8 |
| F | measurement was impossible |

Since developers A and B used only good solvents and a good solvent, respectively, they were highly absorbed by the resist resin, and the resist resin had a higher solubility in the developers. When developer A, which is a conventional developer for ZEN, is used, a deteriorated pattern due to swelling is observed as described before and, consequently, it is understood that this developer cannot inhibit swelling of the resin when the dissolved resin has a molecular particle diameter of not less than 18 nanometers indicated in Table I. Similarly, when developer B of MIBK is used, it is considered that the developer cannot also inhibit swelling of the resin when the dissolved resin has a molecular particle diameter of not less than 21.9 nanometers indicated in Table I.

With developer C in which MIBK, a good solvent, is mixed with IPA, a poor solvent, having a higher polarity in a ratio of 9:1, since the developer has a higher ratio of good solvent to poor solvent, it does not have a significant effect on the size of dissolved resin particle diameter. On the other hand, with developers D and E having a lower ratio of good solvent to poor solvent, the dissolved resins have a clearly smaller molecular particle diameter compared to the resin dissolved in developer B using MIBK alone, and it can be considered that the addition of IPA effectively acts by inhibiting of swelling of the resin as well as shrinkage of the resin. With developer F having a further increased amount of IPA added, however, the amount of IPA is too large to dissolve the resin and a molecular particle diameter could not measured.

Although an increase in volume (swelling) of a resin can thus be inhibited by adding a poor solvent to a good solvent, it is important that conditions, such as a composition ratio of the solvents used, at which the addition of the poor solvent have a useful effect on inhibition of swelling, and a threshold amount of poor solvent, over which a resin is not thoroughly dissolved in the mixed developer of the good and poor solvents, are determined depending on the solvents used, and a mixed composition ratio to be actually used is optimized.

EXAMPLE 2

Using developer B (the developer consisting only of MIBK having a solubility parameter of 8.5, which is a good solvent) and developer D (the mixed developer of MIBK of good solvent and IPA having a solubility parameter of 11.5, which is a poor solvent, in a volume ratio of 8:2) shown in Example 1, development of a 0.5 micrometer line and space pattern of electron beam negative resist, "ZEN", manufactured by Nippon Zeon was evaluated.

A resist film of 0.3 micrometer thick formed on a chromium film on a substrate was patterned using exposure conditions of an electron beam exposure energy of 4.8 $\mu C/cm^3$ and an accelerating voltage of 30 kV, and a developing time of 50 seconds. The results are shown in scanning electron micrographs (SEMS) of FIG. 2 (developer B) and FIG. 3 (developer D).

Figure 2:
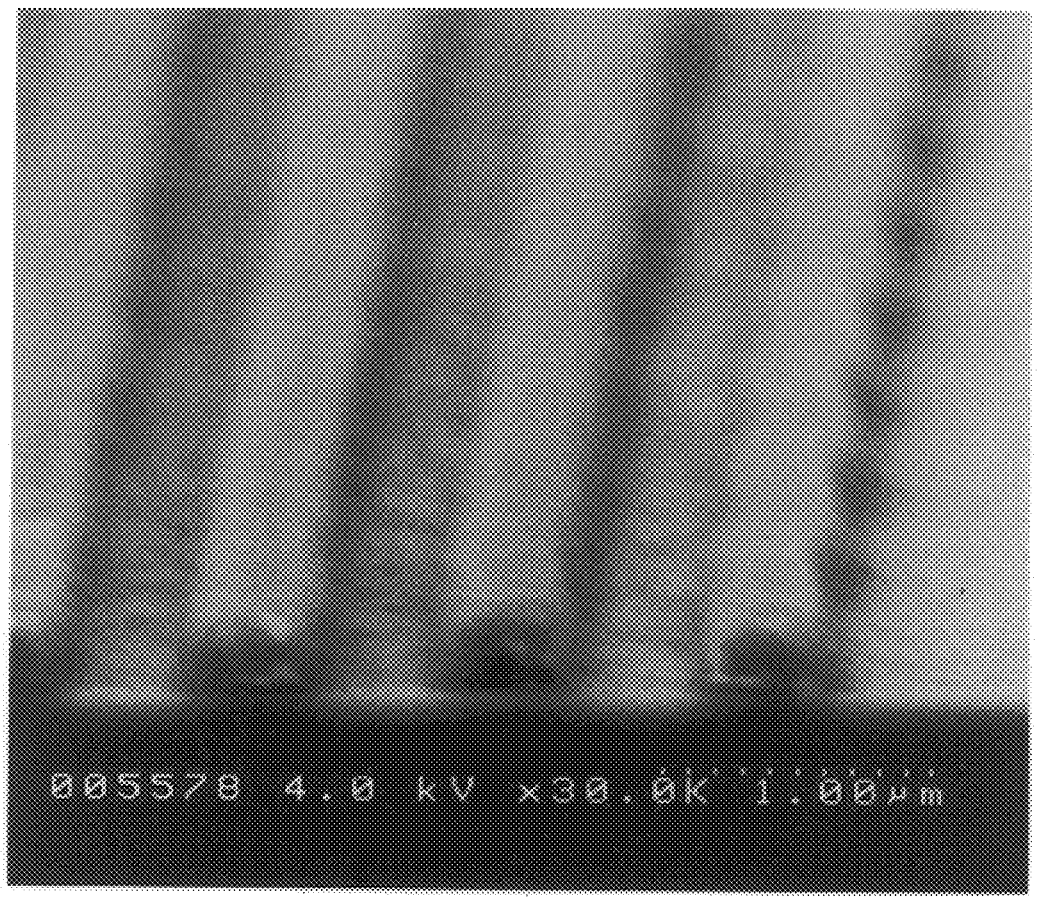
FIG. 2 is a scanning electron micrograph of the resist pattern formed by the good solvent developer in Example 2.
Figure 3:
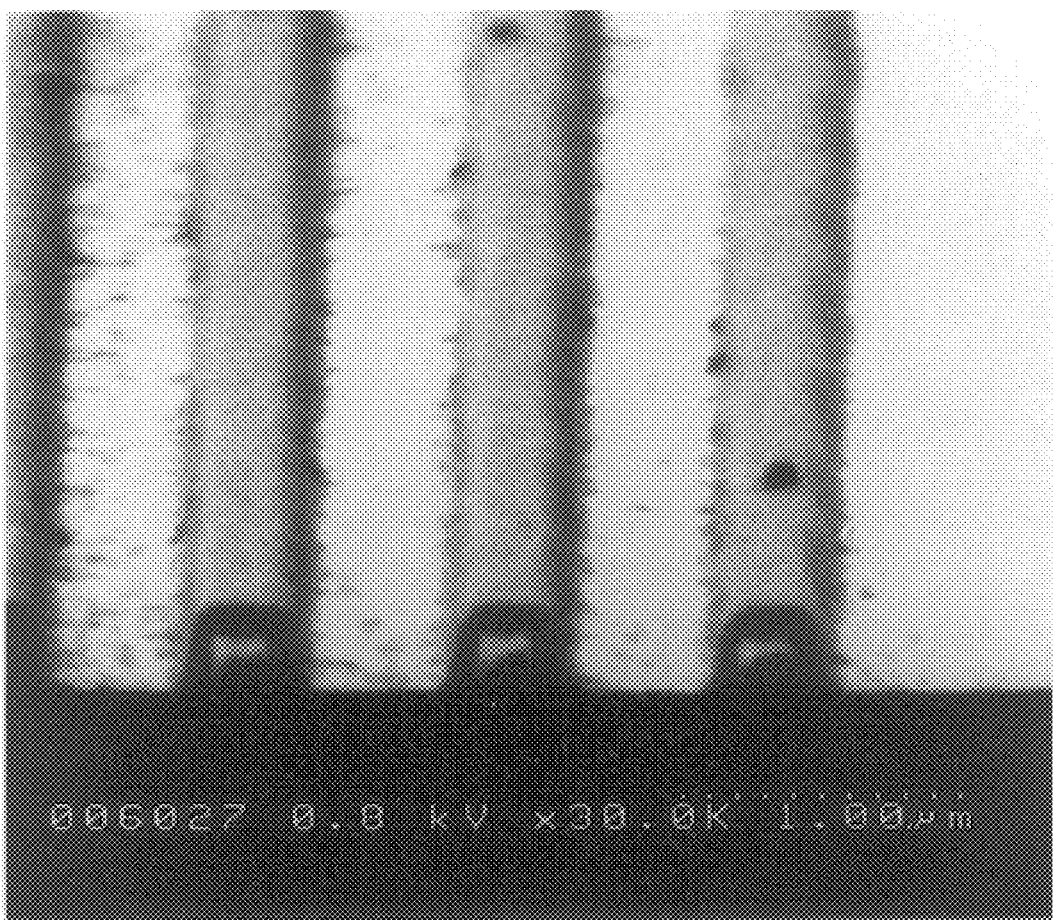
FIG. 3 is a scanning electron micrograph of the resist pattern formed by the mixed developer of good solvent and poor solvent in Example 2.

In the case of the MIBK developer of FIG. 2, indistinct configuration of the formed resist pattern, due to swelling, was observed, and an undulated shape of the most right patterned line resulted from swelling of the line (which received a smaller exposure energy, in contrast with three lines located at the left thereof which received, due to a proximity effect, a larger exposure energy than the most right line) was also observed. In contrast, in the case of the mixed developer of FIG. 3, it can be seen that swelling is inhibited so that the developed pattern is distinct, and the most right patterned line does not have an undulated shape.

EXAMPLE 3

Evaluation was carried out as in Example 2, using a developer consisting only of ethyl acetate, a good solvent, (solubility parameter: 9.1) and a mixed developer of ethyl acetate, a good solvent, and IPA, a poor solvent, in a volume ratio of 8:2.

Figure 4:
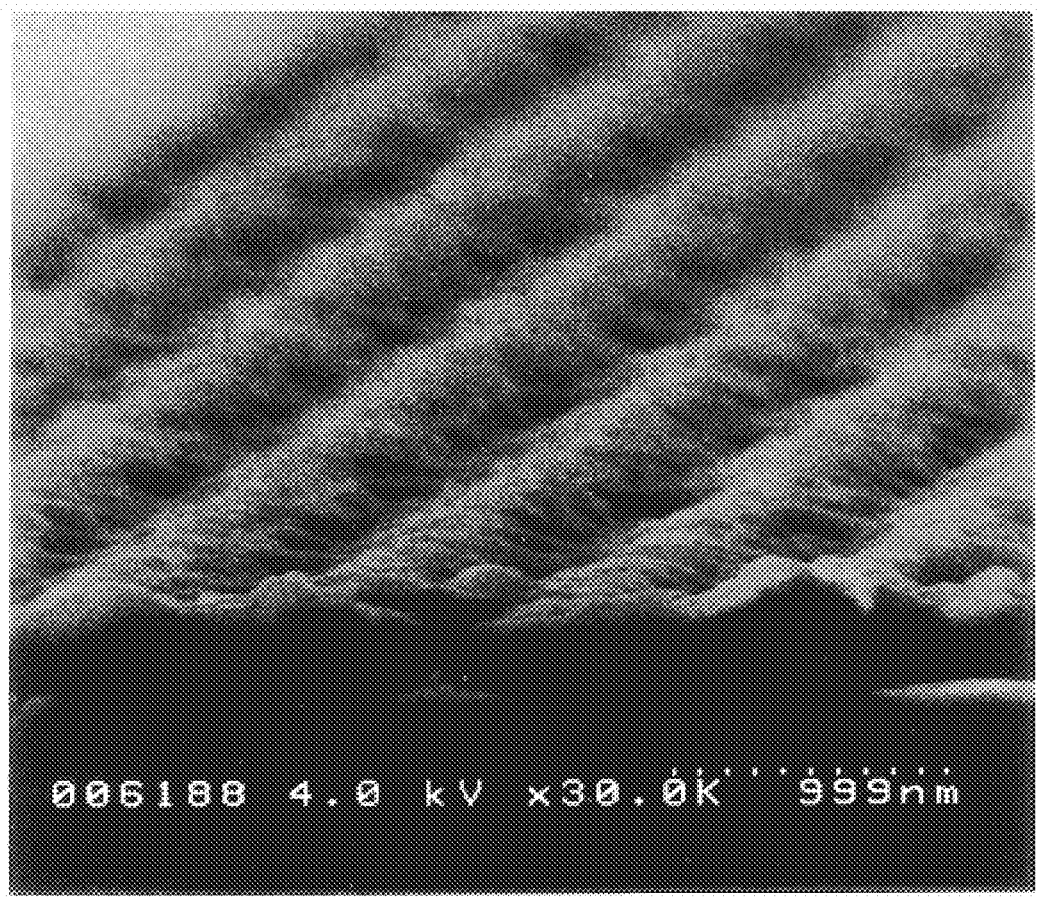
FIG. 4 is a scanning electron micrograph of the resist pattern formed by the good solvent developer in Example 3.
Figure 5:
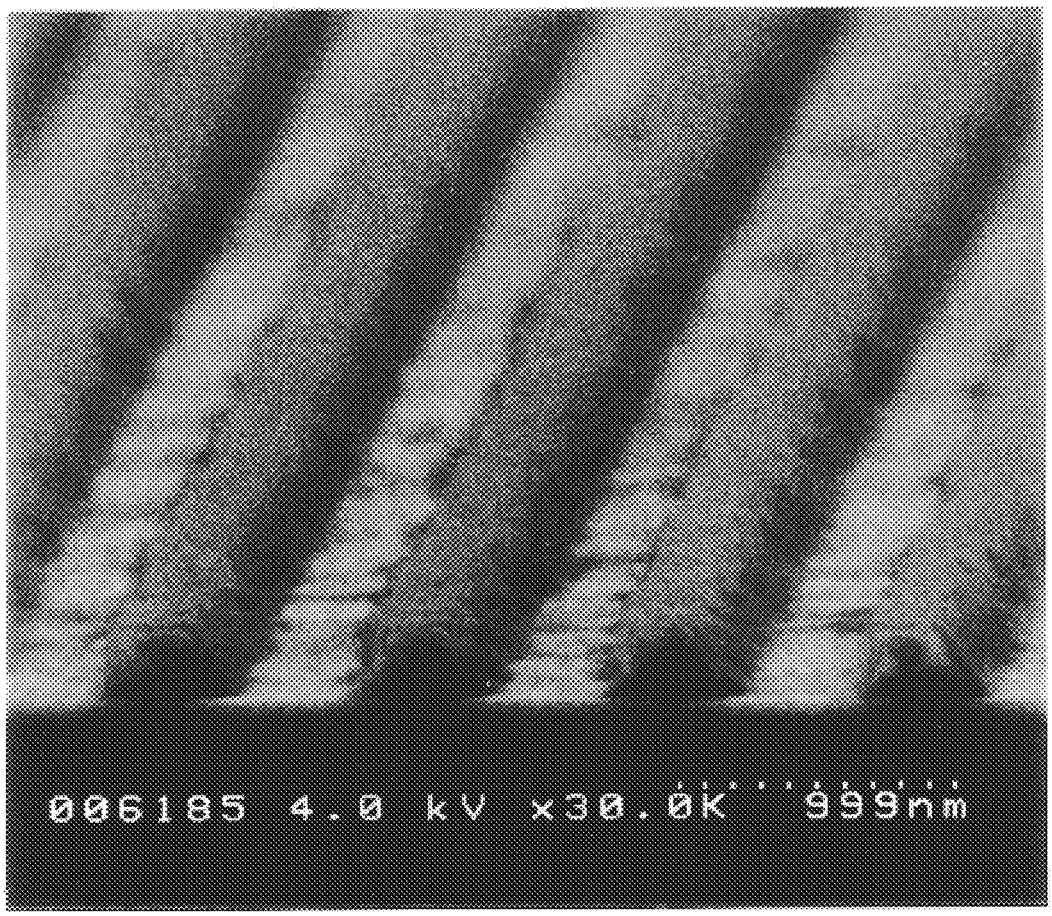
FIG. 5 is a scanning electron micrograph of the resist pattern formed by the mixed developer of good solvent and poor solvent in Example 3.

FIG. 4 shows an SEM of a pattern developed by use of the ethyl acetate developer. In this case, it can be seen that patterned lines adjacently formed are joined together due to swelling of the lines by the developer, and the lines cannot be resolved by exposure. On the other hand, in the case of the mixed developer, it can be observed, from an SEM shown in FIG. 5, that swelling of patterned line is inhibited, and the lines of the pattern are satisfactorily resolved.

As described, by use of a mixed developer of a good solvent and a poor solvent for a resist resin used for the formation of a resist pattern, swelling of the resist resin by the developer during the formation of a mask pattern for a photomask can be inhibited and, accordingly, it becomes possible to form a minute mask pattern having a higher accuracy in size. Consequently, according to the invention, it is possible to provide a photomask of high quality provided with a minute mask pattern.

What is claimed is:

1. A method for the formation of a resist pattern, the method comprising the steps of:

forming a film of a resist resin based on a halogenated alkylstyrene copolymer on a substrate, patterning the resist film by electron beam exposure, and developing the patterned resist film by a developer which is a mixture of a solvent regarded as a good solvent and a solvent regarded as a poor solvent for the resist resin based on a halogenated alkylstyrene, wherein the weight ratio of good solvent to poor solvent in the mixture is from 7.5:2.5 to 8:2.

2. The method of claim 1, wherein the good solvent has a solubility parameter of not less than 8 $(cal/cm^3)^{1/2}$, and less than 11 $(cal/cm^3)^{1/2}$, and the poor solvent has a solubility parameter of less than 8 $(cal/cm^3)^{1/2}$ or not less than 11 $(cal/cm^3)^{1/2}$.

3. The method of claim 1, wherein the good solvent is selected from the group consisting of ethyl cellosolve, ethyl acetate, isoamyl acetate, methyl isobutyl ketone, and mixtures thereof.

4. The method of claim 1, wherein the poor solvent is selected from the group consisting of alcohols, aliphatic compounds, ketones, and mixtures thereof.

5. The method of claim 1, wherein the poor solvent is selected from the group consisting of methanol, ethanol, isopropyl alcohol, n-heptane, n-hexane, diethyl ether, dibutyl ether, and mixtures thereof.

6. A photomask comprising a substrate and a light-screening film having a certain pattern formed thereon, wherein the pattern of the light-screening film is formed by patterning a film of a resist resin based on a halogenated alkylstyrene copolymer provided on the light-screening film by use of electron beam exposure of the resist film and a developer which is a mixture of a solvent regarded as a good solvent and a solvent regarded as a poor solvent for the resist resin, wherein the weight ratio of good solvent to poor solvent in the mixture is from 7.5:2.5 to 8:2.

7. The photomask of claim 6, wherein the good solvent has a solubility parameter of not less than 8 $(cal/cm^3)^{1/2}$ and less than 11 $(cal/cm^3)^{1/2}$, and the poor solvent has a solubility parameter of less than 8 $(cal/cm^3)^{1/2}$ and not less than 11 $(cal/cm^3)^{1/2}$.

8. The photomask of claim 6, wherein the good solvent is selected from the group consisting of ethyl cellosolve, ethyl acetate, isoamyl acetate, methyl isobutyl ketone, and mixtures thereof.

9. The photomask of claim 6, wherein the poor solvent is selected from the group consisting of alcohols, aliphatic compounds, ketones, and mixtures thereof.

10. The photomask of claim 6, wherein the poor solvent is selected from the group consisting of methanol, ethanol, isopropyl alcohol, n-heptane, n-hexane, diethyl ether, dibutyl ether, and mixtures thereof.

\* \* \* \* \*